United States Patent
Bessho et al.

(10) Patent No.: US 6,986,798 B2
(45) Date of Patent: Jan. 17, 2006

(54) CERIUM-BASED ABRASIVE, PRODUCTION PROCESS THEREOF

(75) Inventors: Naoki Bessho, Iwaki (JP); Hideo Tamamura, Chiba (JP)

(73) Assignee: Showa Denko K.K., Tokyo (JP)

(*) Notice: Subject to any disclaimer, the term of this patent is extended or adjusted under 35 U.S.C. 154(b) by 0 days.

(21) Appl. No.: 10/433,046

(22) PCT Filed: Nov. 30, 2001

(86) PCT No.: PCT/JP01/10500

§ 371 (c)(1),
(2), (4) Date: May 30, 2003

(87) PCT Pub. No.: WO02/44300

PCT Pub. Date: Jun. 6, 2002

(65) Prior Publication Data

US 2004/0043613 A1 Mar. 4, 2004

Related U.S. Application Data

(60) Provisional application No. 60/269,843, filed on Feb. 21, 2001.

(30) Foreign Application Priority Data

Nov. 30, 2000 (JP) .................................. 2000-365600

(51) Int. Cl.
*C09K 3/14* (2006.01)

(52) U.S. Cl. ............................................. 51/307; 106/3
(58) Field of Classification Search ................... 51/307, 51/308, 309; 106/3
See application file for complete search history.

(56) References Cited

U.S. PATENT DOCUMENTS 6,776,811 B2    8/2004  Uchino et al.

FOREIGN PATENT DOCUMENTS

| JP | 09-183966 A | 7/1997 |
|---|---|---|
| JP | 2000-017195 A | 1/2000 |
| JP | 2000-026840 A | 1/2000 |
| JP | 2000-109813 A | 4/2000 |
| JP | 2000303060 | * 10/2000 |
| JP | 2002-097457 A | 4/2002 |

* cited by examiner

*Primary Examiner*—Michael Marcheschi
(74) *Attorney, Agent, or Firm*—Sughrue Mion, PLLC

(57) ABSTRACT

A mixed light rare earth compound which has been obtained by chemically removing medium-to-heavy rare earth elements, Nd and impurities other than rare earth elements from an ore containing rare earth elements is fired at 500 to 1100° C. to yield a mixed rare earth oxide. A cerium-based rare earth fluoride is added to the mixed rare earth oxide to obtain a mixture. The mixture is subjected to wet-pulverization, drying, firing, disintegration and classification to thereby yield a cerium-containing abrasive.

5 Claims, 1 Drawing Sheet

CERIUM-BASED ABRASIVE, PRODUCTION PROCESS THEREOF

CROSS REFERENCE TO RELATED APPLICATION

This application is an application filed under 35 U.S.C. §111(a) claiming the benefit pursuant to 35 U.S.C. §119(e)(1) of the filing date of Provisional Application No. 60/269,843 filed Feb. 21, 2001 pursuant to 35 U.S.C §111(b).

TECHNICAL FIELD

The present invention relates to a cerium-containing abrasive to be used for polishing materials, such as glass, and to a method for producing the abrasive. More particularly, the invention relates to a process for producing a cerium-containing abrasive comprising cerium oxide as a predominant component and to be used for finish-polishing a high-precision glass substrate, such as a hard disk substrate of glass, a glass substrate for a liquid crystal display panel, etc.

BACKGROUND ART

In recent years, glass material has found a variety of applications and has given rise to a need for surface polishing of the material in some cases. For example, during production of optical lenses and glass substrates for optical lenses, the surface of glass material must be polished to a very high degree of surface fineness so as to provide a mirror surface. Particularly, flat and defect-free surfaces with minimal surface roughness are required for glass substrates for optical and magnetic disks, those for liquid crystal displays, such as thin-film transistor (TFT) type and twisted nematic (TN) type LCDs, those for color filters of liquid crystal television displays and those for LSI photomasks. This brings about a demand for a surface polishing technique of higher precision.

High heat resistance is demanded of glass substrates for liquid crystal displays, since such substrates undergo high-temperature post-heat-treatment. In addition, substrates have become thinner and thinner in the trend toward weight reduction. Regarding a magnetic disk glass substrate, there are also demands to reduce the thickness of the substrate keeping with the trend in weight reduction and high mechanical strength, particularly rigidity, so as to withstand, for example, deformation of the disk during high-speed rotation. The levels of these demands have become higher year by year.

In order to meet the aforementioned demands for reduced thickness and mechanical strength, improvements have been made to the chemical composition of glass and to the method for producing glass, providing use of a glass substrate predominantly containing aluminosilicate as a substrate for liquid crystal displays or magnetic disks. Regarding a magnetic disk glass substrate, there have conventionally been developed glass-ceramic substrates predominantly containing lithium silicate or quartz crystals as a major component. The glass of these substrates has considerably poor processability, and therefore, when a conventional abrasive is used, processing speed is low to thereby deteriorate productivity. Thus, there are demands for a large polishing rate and high-precision surface polishing performance.

Regarding conventional abrasives employed for surface polishing of a glass substrate, there has been employed an abrasive predominantly comprising rare earth oxide, inter alia cerium oxide, since cerium oxide exhibits a polishing rate several times that of iron oxide, zirconium oxide or silicon dioxide. During use of such an abrasive, abrasive grains are generally dispersed in liquid, such as water. When a conventional cerium-oxide-containing abrasive is used for polishing the aforementioned glass substrate of high hardness, there arises a problem of a poor polishing rate.

Although the polishing mechanism of a cerium-oxide-containing abrasive has not been fully elucidated, it has been phenomenologically confirmed that the polishing proceeds on the basis of synergistic effect of chemical action of cerium oxide on glass and mechanical action attributable to the hardness of cerium oxide particles themselves. However, since a glass substrate predominantly comprising aluminosilicate and a glass-ceramic substrate predominantly comprising lithium silicate have excellent resistance to chemicals, the chemical action of the abrasive is not fully attained. In addition, collapsing of abrasive grains readily occurs, because of the high hardness of these glass substrates (to be processed), resulting in failure to maintain sufficient mechanical action on glass and consequently in deterioration of the processing rate.

In order to maintain the mechanical action for a long period of time, addition of powdered particles of, e.g., alumina or zirconia having higher hardness than a substrate to be processed, to an abrasive composition may be a conceivable approach. However, when this approach is followed, the relative concentration of cerium oxide decreases, resulting in poor chemical action. In addition, powdered particles of high hardness adversely impart defects, such as pits and scratches, to the glass surface (of the substrate to be processed).

The present invention has been accomplished so as to solve the aforementioned problem involved in conventional techniques. Thus, an object of the invention is to provide a process for producing a cerium-containing abrasive that maintains for a long period of time an initial polishing rate relative to a glass material which is hard and is not readily polished at a large polishing rate, and imparts no surface defects, such as pits and scratches, to a material to be polished, such as glass, to thereby provide a polished surface of high quality. Another object of the invention is to provide a cerium-containing abrasive produced through the process.

DISCLOSURE OF THE INVENTION

A cerium-containing abrasive according to the invention comprises cubic composite rare earth oxide and composite rare earth oxy-fluoride, wherein the abrasive contains not less than 90 mass % of rare earth elements in terms of oxide and the rare earth elements contain not less than 55 mass % of cerium in terms of oxide.

The abrasive includes an abrasive, when subjected to X-ray diffraction measurement, having a main peak resulting from the cubic composite rare earth oxide that is not less than 28.2 degrees at 2θ.

The abrasive includes an abrasive, when subjected to X-ray diffraction measurement, having a main peak resulting from the rare earth oxy-fluoride whose intensity ratio to a main peak resulting from the cubic composite rare earth oxide is in the range of 0.2 to 1.0.

The abrasive includes an abrasive having primary particles with a particle size of 10 to 50 nm and a relative surface area of 2 to 10 m$^2$/g.

The abrasive includes an abrasive containing 5 to 10 mass % of fluorine.

A process for producing a cerium-containing abrasive according to the invention comprises firing at 500 to 1100°

C. a mixed light rare earth compound which has been obtained by chemically removing medium-to-heavy rare earth elements, Nd and impurities other than rare earth elements from an ore containing rare earth elements to thereby yield a mixed rare earth oxide.

The producing process includes adding a cerium-based rare earth fluoride to the mixed rare earth oxide and subjecting the resultant mixture to wet-pulverization, drying, firing, disintegration and classification to thereby yield a cerium-containing abrasive.

The producing process includes adding cerium-based rare earth fluoride and mixed rare earth carbonate obtained by carbonating the mixed light rare earth compound to the mixed rare earth oxide and subjecting the resultant mixture to wet-pulverization, drying, firing, disintegration and classification to thereby yield a cerium-containing abrasive.

In the producing process, the rare earth fluoride is fluoride of a cerium-based mixed light rare earth compound that is obtained by adding fluoride to the mixed light rare earth compound and heat-treating the resultant mixture at a temperature of not more than 400° C.

In the producing process, the firing is performed in the atmosphere for 2 to 36 hours using a firing furnace, such as an electrical furnace or a pusher furnace.

The cerium-containing abrasive having the constitution as described above can maintain for a long period of time an initial polishing rate relative to a hard glass material and provide a high-quality polished surface with small surface roughness.

BEST MODE FOR CARRYING OUT THE INVENTION

Figure 1:
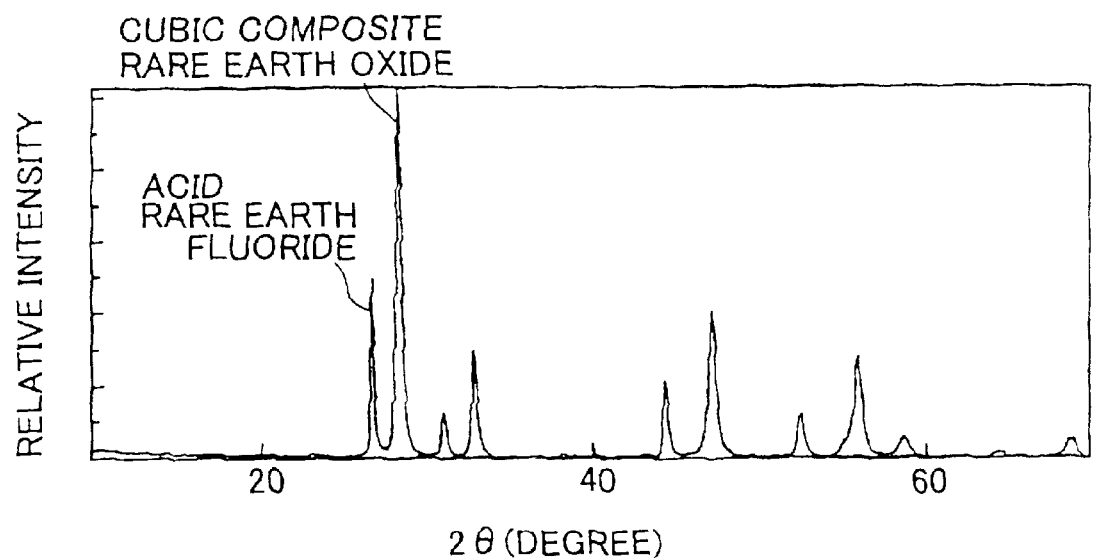
FIG. 1 is an X-ray diffraction diagram of the abrasive obtained in Example 1.

A cerium-containing abrasive according to the invention contains fluorine and specifically comprises cubic composite rare earth oxide and composite rare earth oxy-fluoride, wherein the abrasive contains not less than 90 mass % of rare earth elements in terms of oxide and the rare earth elements contain not less than 55 mass % of cerium in terms of oxide.

The content of the fluorine in the cerium-containing abrasive is preferably in the range of 5 to 10 mass %. When it is less than 5 mass %, the polishing rate becomes small. On the other hand, when it exceeds 10 mass %, the rare earth oxy-fluoride will remain to cause a small polishing rate and form scratches.

When the rare earth elements are shown by RE, the cubic composite rare earth oxide is a compound represented by $RE_2O_3$, for example, and the composite rare earth oxy-fluoride is a compound represented by REOFREO, for example. The cerium-containing abrasive according to the present invention has to be comprised substantially of the two compounds. Why the word "substantially" is used herein is that the cerium-containing abrasive may further contain additives etc. Ordinary X-ray diffraction measurement of the abrasive will detect few crystal peaks resulting from the substances other than the two compounds. It is specified herein that the crystal peaks resulting from the substances are not included in the crystal peaks resulting from the two compounds.

It is specified herein that the content of all the rare earth elements in the abrasive is not less than 90 mass %, preferably not less than 95 mass %, in terms of oxide and that the content of cerium in all the rare earth elements is not less than 55 mass %, preferably not less than 60 mass %, in terms of oxide. The content of all the rare earth elements in the abrasive is measured by analysis with equipment, such as ICP analysis or fluorescent X-ray analysis. The content of the rare earth elements in the abrasive is measured by analysis with equipment, and the measured content is calculated in terms of oxide.

When the content of all the rare earth elements in the cerium-containing abrasive according to the present invention is less than 90 mass % or when the content of cerium in all the rare earth elements is less than 55 mass %, the number of particles not attributable to polishing increases to cause a small polishing rate and generate, during polishing, scratches on a material to be polished.

The cerium-containing abrasive of the present invention, when subjected to X-ray diffraction measurement, preferably has a main peak (at 2θ) resulting from the cubic composite rare earth oxide that is not less than 28.2 degrees. The X-ray diffraction measurement reveals that the main peak resulting from ordinary cerium oxide appears at 27.8 degrees. The main peak in the present invention appears at a position shifted by not less than 0.4 degree toward the high angle side. The reason therefore is that lanthanum oxide, praseodymium oxide, etc. that are rare earth components other than cerium oxide are taken in the cerium oxide to vary the intercrystalline distance. Use of the cerium-containing abrasive having the diffraction peak mentioned above can provide effects of attaining a large polishing rate and reducing scratches generated during polishing.

The X-ray diffraction measurement of the cerium-containing abrasive of the present invention is performed using an X-ray diffraction measuring apparatus made by Kabushiki Kaisha Rigaku under conditions of an X-ray generating voltage of 40 kV, a current of 30 mA, a scan speed of 4.0 degrees/min, a measuring step of 0.02 degree/min, a DS emanation slit of 1, a RS light-receiving slit of 0.3 and an SS scattering slit of 1.

In order for the X-ray diffraction of the invention to strictly prescribe the peak position, CuK α-ray measurement is conducted using a Cu anode as an X-ray pipe bulb and Ni foil as a filter.

The intensity ratio of the main peak resulting from the rare earth oxy-fluoride to the main peak resulting from the cubic composite rare earth oxide, obtained when the cerium-containing abrasive of the present invention is subjected to X-ray diffraction measurement, is preferably in the range of 0.2 to 1.0, more preferably 0.3 to 0.6. In the X-ray diffraction of a cerium-containing abrasive, the main peak resulting from the cubic composite rare earth oxide (at 2θ) and the main peak resulting from the rare earth oxy-fluoride appear at around 28.2 and 26.7 degrees, respectively. The peak intensity means the maximum value of the diffraction intensity. When the intensity ratio of the main peak resulting from rare earth oxy-fluoride to the main peak resulting from the cubic composite rare earth oxide is less than 0.2, it is impossible to sufficiently suppress adverse affection by the lanthanum oxide contained in the cerium containing abrasive, thereby lowering the polishing ratio and shortening the service life of the abrasive. When the intensity ratio exceeds 1.0, the number of the oxy-fluorides lacking in polishing ability increases, thereby lowering the polishing ratio.

The cerium-containing abrasive of the present invention has primary particles whose particle size is preferably in the range of 10 to 50 nm and whose relative surface area is preferably in the range of 2 to 10 m$^2$/g. The primary particle size is measured by calculating the crystallite diameter read from the peak width at half height of the X-ray diffraction peak, and the relative surface area is measured by the BET method.

When the primary particle size is lower than 10 nm, the cerium oxide or oxy-fluoride is not sufficiently crystallized to lower the mechanical polishing power. When it exceeds 50 nm, there give rise to hard large crystals that form scratches. When the relative surface area is less than 2 m$^2$/g, scratches are formed similarly to the case where the primary particle size exceeds 50 nm. When it exceeds 10 m$^2$/g, the polishing rate is lowered.

The process of producing a cerium-containing abrasive according to the present invention preferably includes the step of chemically removing components other than rare earth elements that include alkali metal, alkaline earth metal and radioactive substances, and rare earth components that include medium-to-heavy rare earth elements and Nd from an ore (a rare earth concentrate) containing large quantities of naturally occurring cerium (Ce), lanthanum (La), praseodymium (Pr), neodymium (Nd), etc. to thereby yield, as a primary raw material, a cerium-based mixed light rare earth compound, such as mixed rare earth carbonate or mixed rare earth hydroxide, in which the amounts of these components have been reduced and the step of firing the primary raw material at a temperature of 500 to 1100° C. to yield a mixed rare earth oxide. The term "medium-to-heavy rare earth elements" used herein refers to rare earth elements having an atomic number greater than that of Pm (promethium).

As the method of chemically removing components other than rare earth elements that include alkali metal, alkaline earth metal and radioactive substances, the method of roasting a rare earth concentrate with sulfuric acid is generally used. As the method of chemically removing the rare earth components that include medium-to-heavy rare earth elements and Nd, the solvent extracting method is generally used.

The mixed light rare earth compound that is the primary raw material employed in the present invention can be obtained, for example, by pulverizing a rare earth concentrate containing large quantities of naturally occurring cerium, lanthanum, praseodymium, neodymium, etc., then roasting the pulverized rare earth concentrate with sulfuric acid and dissolving the same in water, subsequently removing components other than rare earth elements, such as alkali metal, alkaline earth metal and radioactive substances as insoluble substances, chemically removing rare earth components including medium-to-heavy rare earth elements and Nd using the solvent extraction method, and converting the resultant to a carbonate salt by use of ammonium bicarbonate or oxalic acid. The mixed light rare earth compound thus obtained preferably contains 45 to 55 mass % of rare earth elements in terms of oxide, and the rare earth elements preferably contain 55 to 63 mass % of cerium oxide, not more than 0.5 mass % of non-rare earth elements and the rest of carbonic acid.

The process of producing a cerium-containing abrasive according to the present invention includes the steps of adding cerium-based rare earth oxy-fluoride to the mixed rare earth oxide obtained by firing, and subjecting the resultant mixture to wet-pulverization, drying, firing, disintegration and classification.

The cerium-based rare earth fluoride is preferably obtained by chemically removing components other than rare earth elements, such as alkali metal, alkaline earth metal and radioactive substances and when necessary in addition thereto medium-to-heavy rare earth elements and Nd from a rare earth concentrate containing large quantities of naturally occurring cerium, lanthanum, praseodymium, neodymium, etc. to provide a mixed light rare earth compound in which the amounts of these components and metals have been reduced; fluorinating the compound using a fluorine source, such as hydrofluoric acid, ammonium fluoride or acidic ammonium fluoride; heat-treating the fluorinated compound at a temperature of not more than 400° C.; and pulverizing the heat-treated compound. The cerium-based rare earth fluoride thus obtained desirably contains rare earth elements in a total amount of 60 to 75 mass % in terms of oxide and fluorine in an amount of 20 to 30 mass %. The term "cerium-based" used herein means that the content of cerium in the rare earth elements is not less than 40 mass %, preferably not less than 60 mass %, in terms of oxide.

When the temperature at which the fluorinated compound is heat-treated in the aforementioned process is higher than 400° C., reactivity of the rare earth compounds, such as rare earth oxide, with the fluorine decreases, producing hard aggregates during firing. The aggregates may be abrasive grains that produce scratches. If such grains are contained, the polishing rate cannot be increased. Therefore, the heat treatment temperature has to be controlled to not more than 400° C.

In the present invention, the mixed light rare earth compound that is a primary raw material is fired at a temperature of 500 to 1100° C. to thereby form mixed rare earth oxide. The thus-obtained mixed rare earth oxide and a cerium-based rare earth fluoride that is a secondary raw material are mixed at a predetermined ratio, and the resultant mixture is wet-micropulverized. The mixing ratio is appropriately determined in accordance with the fluorine content to be required for the final product (cerium-containing abrasive). Thus, in the present invention, the content of fluorine in the final product can be readily regulated if the mixing ratio of the cerium-based rare earth fluoride is modified. Pulverization is carried out by use of a medium mill, such as a wet ball mill. In the present invention, the average particle size of the pulverized product is preferably 0.5 to 3.0 μm.

Subsequently, slurry containing a mixture of the thus-pulverized mixed rare earth oxide and the cerium-based rare earth fluoride is dried and fired. The firing temperature is in the range of 600 to 1100° C., preferably 800 to 1000° C. The fired product is subjected to cooling, disintegration and classification to thereby yield a cerium-containing abrasive. The abrasive preferably has an average particle size of 0.5 to 3.0 μm and contains fluorine preferably in an amount of 1.0 to 10 mass %, preferably 5 to 10 mass %.

In the present invention, the mixed rare earth oxide obtained by firing the mixed light rare earth compound at 500 to 1100° C. is preferably mixed before use with a mixed rare earth carbonate obtained by carbonating a mixed light rare earth compound which has not been fired and with a cerium-based rare earth fluoride. In this case, fluorine contained in the rare earth fluoride reacts with lanthanum contained in the mixed rare earth oxide and mixed rare earth carbonate, yielding lanthanum fluoride. Mixing the mixed rare earth carbonate with the mixed rare earth oxide can promote the reaction between fluorine and lanthanum to yield lanthanum fluoride.

Lanthanum oxide contained in an abrasive has strong basicity, causing plugging of a polishing pad during polishing. This adversely affects circulation of aqueous abrasive slurry for refreshing the surface to be polished. In particular, since a low-cerium-content abrasive has a relatively high lanthanum content, the above problem is likely to arise. In the present invention, since the mixed rare earth oxide is added with mixed rare earth carbonate and cerium-based rare earth fluoride and then subjected to wet-pulverization, drying, firing, disintegration and classification, lanthanum oxide is converted to lanthanum fluoride, thus enabling the aforementioned adverse effect to be suppressed during polishing.

The cerium-containing abrasive of the present invention is used generally in the form of a powder. However, when used as an abrasive, it is generally transformed into an aqueous dispersion thereof and used for finish-polishing a variety of glass materials and glass products, such as glass substrates for optical lenses, for optical or magnetic disks and for liquid crystal displays.

Specifically, the abrasive is dispersed in a dispersion medium such as water to thereby prepare approximately 5 to 30 mass % of slurry for use. Examples of the dispersion medium preferably used in the present invention include water and aqueous organic solvents. Specific examples of the organic solvents include alcohols, polyhydric alcohols, acetone and tetrahydrofuran. Generally, water is employed.

When objects such as glass substrates are polished by use of the cerium-containing abrasive of the present invention, no surface defects, such as pits and scratches, are generated, providing polished surfaces of excellent quality.

The present invention will next be described in detail by way of examples, which should not be construed as limiting the invention thereto.

EXAMPLE 1

A rare earth concentrate (ore) containing 47 mass % of rare earth elements calculated in terms of oxide, 53 mass % of impurities other than the rare earth elements, 2 mass % of medium-to-heavy rare earth elements calculated in terms of oxide and 8 mass % of Nd calculated in terms of oxide was treated to obtain a mixed light rare earth compound in which the content of the impurities other than the rare earth elements was reduced to not more than 1 mass % and the contents of the medium-to-heavy rare earth elements and Nd were reduced respectively to not more than 1 mass %. The compound was carbonated using ammonium bicarbonate to obtain mixed rare earth carbonate.

The mixed rare earth carbonate thus produced contained 49 mass % of rare earth elements that contained 60 mass % of cerium, both calculated in terms of oxide. Two liters of the mixed rare earth carbonate was fired in an electric furnace at 800° C. for 2 hours to obtain mixed rare earth oxide. To 1 kg of the mixed rare earth oxide, was added 300 g of cerium-based rare earth fluoride (containing 27 mass % of fluorine and 45 mass % of rare earth elements calculated in terms of oxide that contained 45 mass % of cerium calculated in terms of oxide) produced by adding fluoric acid to the mixed light rare earth compound and heat-treating the resultant mixture at 400° C. for 2 hours. The resultant mixture was pulverized with a wet ball mill to obtain slurry that contains particles having an average particle size (D50) of 1.5 $\mu$m. The slurry was dried, fired in an electrical furnace at 900° C. for 2 hours and subjected to cooling, disintegration and classification to produce a cerium-containing abrasive. The average particle size (D50) used herein means the particle size corresponding to a 50% cumulative volume as determined from the particle size distribution curve and measured using a Coulter Multisizer (produced by Coulter Kabushiki Kaisha) equipped with a 30 $\mu$m-aperture tube.

The cerium-containing abrasive thus obtained was dispersed in water to obtain slurry having a concentration of 10 mass %. With the slurry polishing liquid, alkaline-free glass plates for thin-film transistor (TFT) panels were polished under the following conditions, and the states of the polished surfaces were evaluated.
Polishing conditions:
 Polishing machine: 4-way double-sided polishing machine
 Object to be processed: 5 cm-side alkaline-free glass plate with an area of 25 $cm^2$
 Number of processed plates: 3 plates/batch×2 batches
 Polishing pad: Foamed polyurethane pad (LP-77, product of Rhodes)
 Number of revolution of the turntable: 90 rpm
 Feed rate of slurry: 60 ml/min
 Operation pressure: 156 g/$cm^2$
 Polishing time: 30 min.

Six alkaline-free glass plates for TFT panels were polished. The thickness of each plate was measured, before and after polishing, at four points by use of a micrometer. The measured values (4 points×6 plates) were averaged, and the average thickness value was used as the polishing rate ($\mu$m/min). In addition, the surface of each glass plate was visually observed using a halogen lamp of 200000 lx as a light source to count the number of scratches per polished surface. The central-line surface roughness of each glass plate was measured by means of Taly-step (product of Rank-Taylor Hobson).

The results obtained, including the average particle size (D50) of each abrasive, polishing rate and central-line surface roughness (Ra), are shown in Table 1 below. In addition, the results of X-ray diffraction measurement are shown in FIG. 1, and the physical properties of the abrasive are shown in Table 2 below.

EXAMPLE 2

The procedure of Example 1 was repeated, except that 80 weight parts of mixed rare earth carbonate obtained by carbonating an unfired mixed light rare earth compound with ammonium bicarbonate were substituted for 40 mass parts of the mixed rare earth oxide used as the primary raw material, thereby forming a mixture of the mixed rare earth oxide and the mixed rare earth carbonate to yield a cerium-containing abrasive.

Polishing was performed by use of the thus-obtained cerium-containing abrasive in a manner similar to that employed in Example 1, and the state of the polished surface was evaluated. The polishing characteristics and physical properties of the abrasive are shown respectively in Tables 1 and 2 below.

COMPARATIVE EXAMPLE 1

The procedure of Example 1 was repeated, except that the mixed rare carbonate was fired at 1200° C., to thereby yield a cerium-containing abrasive.

Figure 2:
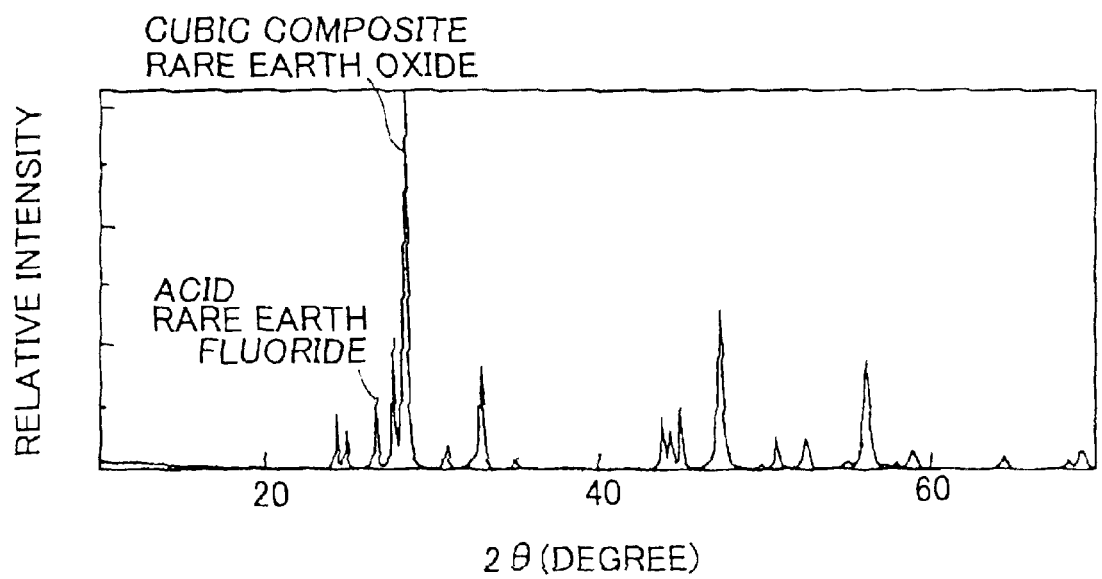
FIG. 2 is an X-ray diffraction diagram of the abrasive obtained in Comparative Example 1.

In the same manner as in Example 1, polishing was performed using the thus-obtained cerium-containing abrasive, and the state of the polished surface was evaluated. The polishing characteristics and physical properties of the abrasive are shown respectively in Tables 1 and 2 below, and the results of the X-ray diffraction measurement are shown in FIG. 2.

COMPARATIVE EXAMPLE 2

The procedure of Example 1 was repeated, except that cerium-based rare earth fluoride was heat-treated at 800° C., to thereby yield a cerium-containing abrasive.

Polishing was performed by use of the thus-obtained cerium-containing abrasive in a manner similar to that employed in Example 1, and the state of the polished surface was evaluated. The polishing characteristics and physical properties of the abrasive are shown respectively in Tables 1 and 2 below.

TABLE 1

|  | Ave. particle size D50 ($\mu$m) | Polishing rate ($\mu$m/min) | Scratches (number/surface) | Surface roughness Ra (Å) |
|---|---|---|---|---|
| Example 1 | 1.54 | 2.55 | 0.17 | 9 |
| Example 2 | 1.46 | 2.68 | 0.08 | 8 |
| Comp. Ex. 1 | 1.55 | 2.23 | 0.50 | 13 |
| Comp. Ex. 2 | 1.63 | 2.12 | 0.83 | 15 |

TABLE 2

|  | Main peak position (deg) | Main peak intensity ratio | Primary particle size (nm) | Relative surface area (m$^2$/g) |
|---|---|---|---|---|
| Example 1 | 28.5 | 0.52 | 30 | 4 |
| Example 2 | 28.5 | 0.45 | 40 | 3 |
| Comp. Ex. 1 | 28.5 | 0.18 | 80 | 2 |
| Comp. Ex. 2 | 28.1 | 0.30 | 70 | 1.6 |

As is clear from Tables 1 and 2 above, in Examples 1 and 2, there were obtained cerium-containing abrasives that provided a high polishing rate, generated substantially no scratch on the polished surface of the alkaline-free glass and provided a high-quality polished surface having small surface roughness.

In contrast, in Comparative Example 1, since the temperature at which the mixed light rare earth compound was fired was high, the reaction with the added rare earth fluoride did not proceed sufficiently to allow non-reacted rare earth fluoride to remain. In addition, the polishing rate was high, and scratches were generated to increase the surface roughness.

In Comparative Example 2, the effect of enhancing the polishing rate was poor, because of the large average particle size attributed to high heat-treatment temperature of the added mixed rare earth fluoride. In addition, scratches were generated to increase the surface roughness and impair the quality of the polished surface.

INDUSTRIAL APPLICABILITY

Use of the cerium-containing abrasive according to the present invention can maintain a good polishing rate for a long period of time even relative to hard glass, and enables a polished object to have a good-quality surface with few scratches and small surface roughness.

What is claimed is:

1. A cerium-containing abrasive comprising cubic composite rare earth oxide and composite rare earth oxy-fluoride, wherein the abrasive contains not less than 90 mass % of rare earth elements in terms of oxide and the rare earth elements contain not less than 55 mass % of cerium in terms of oxide.

2. The abrasive according to claim 1, wherein the abrasive, when subjected to X-ray diffraction measurement, has a main peak resulting from the cubic composite rare earth oxide that is not less than 28.2 degrees at 2θ.

3. The abrasive according to claim 1 or claim 2, wherein the abrasive, when subjected to X-ray diffraction measurement, has an intensity ratio of a main peak resulting from the rare earth oxy-fluoride to a main peak resulting from the cubic composite rare earth oxide of 0.2 to 1.0.

4. The abrasive according to claim 1, wherein the abrasive has primary particles with a particle size of 10 to 50 nm and a relative surface area of 2 to 10 m$^2$/g.

5. The abrasive according to claim 1, wherein the abrasive contains 5 to 10 mass % of fluorine.

* * * * *